US007314768B2

(12) United States Patent
Furuse et al.

(10) Patent No.: US 7,314,768 B2
(45) Date of Patent: Jan. 1, 2008

(54) FORMATION METHOD OF ELECTROCONDUCTIVE PATTERN, AND PRODUCTION METHOD OF ELECTRON-EMITTING DEVICE, ELECTRON SOURCE, AND IMAGE DISPLAY APPARATUS USING THIS

(75) Inventors: Tsuyoshi Furuse, Kanagawa-ken (JP); Shosei Mori, Kanagawa-ken (JP); Masahiro Terada, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 320 days.

(21) Appl. No.: 11/138,332

(22) Filed: May 27, 2005

(65) Prior Publication Data

US 2005/0266589 A1 Dec. 1, 2005

(30) Foreign Application Priority Data

Jun. 1, 2004 (JP) ............................ 2004-162968

(51) Int. Cl.
*H01L 21/00* (2006.01)
*H01L 21/44* (2006.01)

(52) U.S. Cl. .......................... 438/21; 438/29; 438/674; 257/E21.295

(58) Field of Classification Search .................. 438/21, 438/29, 674
See application file for complete search history.

(56) References Cited

U.S. PATENT DOCUMENTS

| | | | | |
|---|---|---|---|---|
| 6,113,448 | A | 9/2000 | Kobayashi et al. | 445/24 |
| 6,586,155 | B2 | 7/2003 | Furuse et al. | 430/270.1 |
| 6,833,224 | B2 | 12/2004 | Furuse et al. | 430/16 |
| 6,992,434 | B2 | 1/2006 | Terada et al. | 313/495 |
| 2004/0087239 | A1 * | 5/2004 | Shimoda et al. | 445/50 |
| 2005/0008955 | A1 | 1/2005 | Furuse et al. | 430/12 |
| 2005/0266589 | A1 | 12/2005 | Furuse et al. | 438/21 |
| 2006/0045961 | A1 | 3/2006 | Furuse et al. | 427/77 |
| 2006/0057279 | A1 | 3/2006 | Terada et al. | 427/77 |

FOREIGN PATENT DOCUMENTS

JP 5-114504 5/1993

* cited by examiner

*Primary Examiner*—Alexander Ghyka
(74) *Attorney, Agent, or Firm*—Fitzpatrick, Cella, Harper & Scinto

(57) ABSTRACT

In regard to an electroconductive pattern including a high resistivity region partially, by forming a pattern with a photosensitive resin, making the pattern absorb liquid containing a metal component, and baking this, an electroconductive film of metal oxide is formed, this electroconductive film is further covered by a gas shielding layer, and portions which are not shielded are reduced selectively to be made low resistance metal film regions. Since the material which constitutes the electroconductive pattern is hardly removed, a load concerning material reuse is mitigated and material cost is reduced.

12 Claims, 8 Drawing Sheets

FORMATION METHOD OF ELECTROCONDUCTIVE PATTERN, AND PRODUCTION METHOD OF ELECTRON-EMITTING DEVICE, ELECTRON SOURCE, AND IMAGE DISPLAY APPARATUS USING THIS

BACKGROUND OF THE INVENTION

1. Field of the Invention

The present invention relates to a method of forming electroconductive patterns such as an electrode and wiring, and a production method of an electron-emitting device, an electron source, and an image apparatus device which form necessary electrodes and wiring using this.

2. Related Background Art

What are known heretofore as formation methods of electroconductive patterns which become electrodes and wiring are a method of printing an electroconductive paste into a desired pattern by screen printing, and performing drying and baking to form an electroconductive pattern, a transfer method, a method of applying an electroconductive past to an entire surface, and performing drying and baking to form a metal film, and covering a necessary location with a mask such as photoresist and performing etching processing of the other portion to form a necessary electroconductive pattern, and a method of making a metal paste photosensitive, exposing a necessary location, and performing development to form an electroconductive pattern (refer to Japanese Patent Application Laid-Open No. H5-114504).

Nevertheless, when an electroconductive pattern which has high resistivity regions and low resistance regions is formed in a pattern, the above-mentioned method has such a problem that a facility load is large since there is only way of repeating a step of forming a low resistance region, and a step of forming a high resistivity region, by using each material. In addition, the above-mentioned method has another problem that there are many materials, which are removed by development and the like not to be used, and hence, efficiency is low.

SUMMARY OF THE INVENTION

The present invention aims at providing a production method of an electroconductive pattern which can form an electroconductive pattern effectively by using a material more simply without repeating the same step even if it is the electroconductive pattern which has a high resistivity part.

Furthermore, the present invention also aims at providing a method of producing an electron-emitting device, an electron source, and an image display apparatus at lower cost by using the production method of an electroconductive pattern for the formation of an electrode or wiring.

The present invention is a formation method of an electroconductive pattern including a high resistivity region partially, and a formation method of an electroconductive pattern characterized by having a resin pattern forming step of forming a resin pattern using a photosensitive resin, an absorbing step of making the above-mentioned resin pattern absorb liquid containing a metal component, a baking step of baking the resin pattern which absorbs the above-mentioned liquid containing a metal component to form an electroconductive film of a metal oxide, and a reducing step of covering a desired region of the above-mentioned electroconductive film with a gas shielding layer, heating the above-mentioned electroconductive film under an evacuated or reductive atmosphere, and reducing regions except the above-mentioned desired region.

In addition, the present invention is a production method of an electron-emitting device having an electrode, and a production method of an electron-emitting device characterized in that the electrode is formed by the above-mentioned formation method of an electroconductive pattern.

Furthermore, the present invention is a production method of an electron source having a plurality of electron-emitting devices which have electrodes respectively, and wiring for driving the electron-emitting devices, and a production method of an electron source characterized in that at least either of the above-mentioned electrode or wiring is formed by the above-mentioned formation method of an electroconductive pattern.

Moreover, the present invention is a production method of an image display apparatus which has an electron source having a plurality of electron-emitting devices having electrodes respectively, and wiring for driving the electronic devices, and an image forming member which emits light by the irradiation of electrons emitted from the above-mentioned electron-emitting devices, and a production method of an image display apparatus characterized in that the above-mentioned electron source is produced by the above-mentioned production method of an electron source.

DESCRIPTION OF THE PREFERRED EMBODIMENTS

Figure 1A:
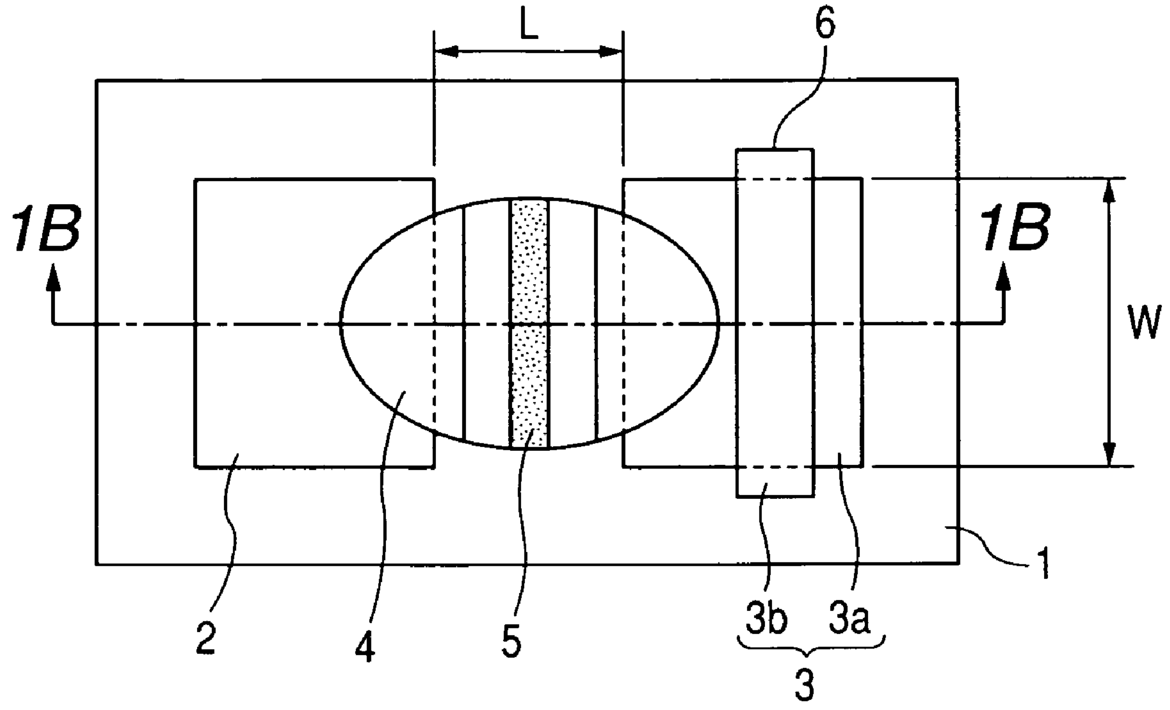
FIGS. 1A and 1B are schematic diagrams showing the structure of an example of an electron-emitting device according to the present invention.

A first aspect of the present invention is a formation method of an electroconductive pattern including a high resistivity region partially, and a formation method of an electroconductive pattern characterized by having a resin pattern forming step of forming a resin pattern using a photosensitive resin, an absorbing step of making the above-mentioned resin pattern absorb liquid containing a metal component, a baking step of baking the resin pattern which absorbs the above-mentioned liquid containing a metal component to form an electroconductive film of a metal oxide, and a reducing step of covering a desired region of the above-mentioned electroconductive pattern with a gas shielding layer, heating the above-mentioned electroconductive film under an evacuated or reductive atmosphere, and reducing regions except the above-mentioned desired region.

A second aspect of the present invention is a production method of an electron-emitting device having an electrode, and is characterized in that the electrode is formed by the formation method of an electroconductive pattern according to the above-mentioned first aspect of the present invention.

A third aspect of the present invention is a production method of an electron source having a plurality of electron-emitting devices which have electrodes respectively, and wiring for driving the electron-emitting devices, and is characterized in that at least either of the above-mentioned electrode and wiring is formed by the formation method of an electroconductive pattern according to the above-mentioned first aspect of the present invention.

A fourth aspect of the present invention is a production method of an image display apparatus which has an electron source having a plurality of electron-emitting devices having electrodes respectively, and wiring for driving the electron-emitting devices, and an image forming member which emits light by the irradiation of electrons emitted from the above-mentioned electron-emitting devices, and is characterized in that the above-mentioned electron source is produced by the above-mentioned production method of an electron source according to the above-mentioned third aspect of the present invention.

The present invention exhibits the following effects.

(1) Since a material which constitutes an electroconductive pattern is hardly removed in the middle of a forming step of an electroconductive pattern, for example, when an electroconductive pattern such as an electrode and wiring is formed, a constituent material of the electroconductive pattern removed in the middle of the step is suppressed to the minimum. Hence, a load related to recovery and reuse of the constituent material of an electroconductive pattern removed in the middle of the step can be kept to the minimum. Then, with producing an electron-emitting device, an electron source, and an image display apparatus using this formation method of an electroconductive pattern, the above-mentioned load at the time of the production of these is significantly reducible.

(2) Since it is possible to form an electroconductive pattern and a high resistivity part with the least amount of metal component because of the same reason as the above, it is possible to suppress the cost at the time of forming many electrodes and wiring patterns over a large area.

(3) The present invention can keep adverse effects on not only a work environment but also a natural environment to the minimum by using a water-soluble photosensitive resin as the photosensitive resin to be used, and further selecting an aqueous solution as the liquid which contains a metal component. Furthermore, since it is not necessary to use strong acid for patterning, it is not necessary to care for an accuracy drop by the corrosion of a substrate due to strong acid and the like to be able to form a desired fine electroconductive pattern with high accuracy.

(4) According to the present invention, it is possible to form an electroconductive pattern, which has a high resistivity region and a low resistance region in a pattern, in steps whose number is smaller than before. Hence, it is possible to increase production efficiency in the production of the electron-emitting device, electron source, and image display apparatus where this formation method of an electroconductive pattern is used.

A formation method of an electroconductive pattern of the present invention has a feature of using a photosensitive resin and liquid containing a metal component. There exist an electrode and wiring as representative examples of an electroconductive pattern formed by the present invention. Furthermore, the present invention is preferably applied to the production of an electron-emitting device, an electron source, having a plurality of electron-emitting devices, and further, an image display apparatus using this electron source.

As an example of the above-mentioned electron-emitting device, it is possible to cite a surface conduction type electron-emitting device in which electrically high resistance location including a fissure is formed by forming an electroconductive thin film connected to a pair of device electrodes facing each other and formed on an electrically insulated substrate and giving energization processing called forming to this electroconductive thin film, and locally breaking, modifying, or deteriorating the electroconductive thin film, and then, when a voltage is applied between device electrodes, and a current parallel to an electroconductive thin film face is sent, a phenomenon which generates electron emission from a high resistance location (electron-emitting region) electrically, including the above-mentioned fissure, is used. In addition, as other examples, it is possible to cite a field emission type electron-emitting device called an “FE type”, and an electron-emitting device having the structure of metal/insulating layer/metal type called an “MIM type”.

Furthermore, as an electron source having a plurality of electron-emitting devices and wiring for driving the plurality of electron-emitting devices, it is possible to cite a passive matrix arrangement where a plurality of electron-emitting devices are arranged in matrix in X and Y directions, one sides of device electrodes of the plurality of electron-emitting devices which are arranged in the same line are connected commonly to wiring in the X direction, and another sides of device electrodes of the plurality of electron-emitting devices arranged in the same column are connected commonly to wiring in the Y direction.

Moreover, as an image display apparatus, it is possible to cite a device where such an electron source as to be described above and an image forming member which emits light by the irradiation of electron rays emitted from electron-emitting devices of this electron source are combined. When using what has a phosphor which emits visible light by electrons as the image forming member, it is possible to make it a display panel used as a television or computer display unit. In addition, when using a photosensitive drum as the image forming member and making it possible to develop a latent image, formed on this photosensitive drum, using toner by the irradiation of electron rays, it is possible to use it as a copy machine or a printer.

Hereafter, what will be explained in order are materials (photosensitive resin, liquid containing a metal component) used in the present invention, an electroconductive pattern formation method of the present invention, a production method of an electron-emitting device, an electron source, and an image display apparatus that is the present invention.

(1) Photosensitive Resin

As long as a resin pattern formed using this as the photosensitive resin used in the present invention can absorb liquid containing a metal component described later, there is not especially any limitation, and hence, a water-soluble photosensitive resin or a solvent-soluble photosensitive resin is sufficient. The water-soluble photosensitive resin means a photosensitive resin which can be developed with water or a developer containing 50 or more mass % of water in a developing step described later. The solvent-soluble photosensitive resin means a photosensitive resin which can be developed with an organic solvent or a developer containing 50 or more mass % of organic solvent in a developing step.

The photosensitive resin may be a type of having an exposure group in resin structure, or a type of mixing a sensitizer with a resin, such as a cyclized rubber-bisazido system resist. Also in any type of photosensitive resin component, a photoreactive initiator or a photoreactive inhibitor can be mixed suitably. In addition, a photosensitive resin coating film soluble in a chemical developer may be a type (negative type) of being insolubilized in a chemical developer by optical irradiation or a photosensitive resin coating film insoluble in a chemical developer may be a type (positive type) of being solubilized in a chemical developer by optical irradiation.

Although general photosensitive resins can be widely used in the present invention as mentioned above, it is preferable to select a resin having a component which reacts with a component of the liquid containing a metal component described later and is hard to produce a precipitate or a gel in the liquid concerned. In addition, it is preferable to use a water-soluble photosensitive resin since it is easy to maintain a favorable work environment and a load given to natural by waste is small, and the like.

Further, when the water-soluble photosensitive resin is explained, it is possible to use what uses a developer which contains 50 or more mass % of water and less than 50 mass % of lower alcohol such as methanol, or ethyl alcohol for increasing a drying rate, or a developer which contains a component for aiming at solution promotion, stability improvement, and the like of a photosensitive resin component, as this water-soluble photosensitive resin. Nevertheless, from a viewpoint of mitigating an environmental impact, what is preferable is a resin which can be developed with a developer containing 70 or more mass % of water. What is more preferable is a resin which can be developed with a developer containing 90 or more mass % of water. Further, what is most preferable is a resin which can be developed only with water as a developer. As this water-soluble photosensitive resin, it is possible to cite resins using water-soluble resins such as a polyvinyl alcohol system resin and a polyvinyl pyrrolidone system resin.

(2) Liquid Containing Metal Component

So long as the liquid containing a metal component which is used in the present invention can form an electroconductive film by baking, either an organic solvent system solution using an organic solvent system solvent containing 50 or more mass % of organic solvent or an aqueous solution using a water solvent containing 50 or more mass % of water may be sufficient. It is possible to use a solution, where an organic solvent-soluble or water-soluble organic compound such as ruthenium, palladium, nickel, or copper is dissolved as a metal component in an organic solvent system solvent or a water solvent, as this solution containing a metal component. Preferably, it is possible to cite a complex compound of the above-mentioned metal.

An aqueous solution is preferable as the liquid containing the metal component which is used in the present invention, since it is easy to maintain a favorable work environment and the load given to the natural by waste is small, similarly to the above-mentioned photosensitive resin. It is possible to use what contains 50 or more mass % of water and less than 50 mass % of lower alcohol such as methanol, or ethyl alcohol for increasing a drying rate, or what contains a component for aiming at solution promotion, stability improvement, and the like of a metal organic compound, as a water solvent of this solution. Nevertheless, from the viewpoint of mitigating an environmental impact, it is preferable that the content of water is 70 or more mass %, it is more preferable that the content of water is 90 or more mass %, and it is most preferable that the solvent is just water.

Furthermore, in order to enhance the film quality of an electroconductive pattern obtained, and to enhance adhesion with a substrate, it is preferable that a simple substance or a compound of rhodium, bismuth, vanadium, chromium, tin, lead, silicon, or the like is added to the above-mentioned solution containing a metal component.

(3) Formation Method of Electroconductive Pattern

Specifically, the formation method of an electroconductive pattern according to the present invention can be performed through the following resin pattern forming steps (a coating step, a drying step, an exposing step, and a developing step), an absorbing step, a cleaning step, a baking step, and a reducing step.

The coating step is a step of applying the above-mentioned photosensitive resin and forms a coating film on an insulating substrate on which an electroconductive pattern is to be formed. This coating can be performed using various printing methods (screen printing, offset printing, flexographic printing, and the like), a spinner method, a dipping method, a spray method, a stamp method, a rolling method, a slit coater method, an ink jet method, or the like.

The drying step is a step of volatilizing a solvent in a photosensitive resin coating film applied on the substrate at the above-mentioned coating step to dry the coating film. Although this drying of a coating film can also be performed under room temperature, it is preferable to perform the drying under heating so as to shorten drying time. Baking can be performed, for example, using a windless oven, a drying oven, a hot plate, or the like. Depending on the composition, coverage, or the like of a photosensitive resin which is applied, the baking can be generally performed by placing an object for 1 to 30 minutes under the temperature of 50 to 100° C.

The exposing step is a step of exposing a photosensitive resin coating film on the substrate, which is dried at the above-mentioned drying step, according to a predetermined resin pattern (for example, a predetermined shape of electrodes and wiring). A range where optical irradiation is performed for exposure at the exposing step depends on whether a photosensitive resin to be used is a negative type or a positive type. In the case of the negative type which becomes insoluble in a chemical developer by optical irradiation, regions to be left as a resin pattern are irradiated and exposed by light. Nevertheless, in the case of the positive type which becomes soluble in a chemical developer by optical irradiation, contrary to the negative type, regions except regions to be left as a resin pattern are irradiated and exposed by light. It is possible to select an optical irradiation region and a non-irradiation region similarly to an ordinary method in mask formation with a photoresist.

The developing step is a step of removing the photosensitive resin coating film in regions other than the regions to be left as a desired resin pattern in the photosensitive resin coating film exposed at the above-mentioned exposing step. When the photosensitive resin is the negative type, the photosensitive resin coating film which has not given the optical irradiation is soluble in a chemical developer, and exposed portions of the photosensitive resin coating film which are given the optical irradiation become insoluble in a chemical developer. Hence, it is possible to perform development by dissolving and removing the non-exposed portions of the photosensitive resin coating film which are soluble in a chemical developer. When the photosensitive resin is the positive type, the photosensitive resin coating film which has not given the optical irradiation is insoluble in a chemical developer, and the exposed portions of the photosensitive resin coating film which are given the optical irradiation become soluble in a chemical developer. Hence, it is possible to perform development by dissolving and removing the exposed portions of the photosensitive resin coating film which are soluble in a chemical developer. Furthermore, when a water-soluble photosensitive resin is used, it is possible to use, for example, water or the same chemical developer as the chemical developer used for a water-soluble normal photoresist, as the chemical developer.

The absorbing step is a step of making the resin pattern, formed at the above, absorb the liquid containing a metal component. The absorption is performed by making the resin pattern, formed at the above, contact to the liquid containing a metal component. Specifically, the absorption can be performed by, for example, a dipping method of soaking the resin pattern into the above-mentioned liquid containing a metal component, a coating method of applying the above-mentioned liquid containing a metal component to the resin pattern by a spray method, a spin coating method, or the like. Before making the liquid containing a metal component contact, for example, in the case of using the above-mentioned aqueous solution, it is also possible to swell the resin pattern by using the above-mentioned water system solvent.

The cleaning step is a step of making the resin pattern absorb the liquid which contains a metal component, and thereafter, removing and clearing the excessive liquid adhering to the resin pattern, and the excessive liquid adhering to locations other than the resin pattern. When the above-mentioned excessive liquid can be sufficiently shaken off, for example by air-blowing, vibration, or the like, this cleaning step can be also omitted, but it is preferable to execute this step so as to prevent a residue of an unnecessary electroconductive material securely. By using the same cleaning liquid as the solvent in the above-mentioned liquid containing metal, this cleaning step can be executed by a method of soaking the substrate, on which the above-mentioned resin pattern is formed, in this cleaning liquid, by spraying the cleaning liquid on the substrate on which the above-mentioned resin pattern is formed, or the like. In this cleaning step, although the above-mentioned liquid containing a metal component is removed a little, its amount is extremely minute. Hence, even if this is recovered and reused, it is possible to mitigate a load significantly in comparison with the conventional.

The baking step is a step of baking the resin pattern (the optical irradiation portions of the photosensitive resin coating film in the case of the negative type, or the non-exposed portions of the photosensitive resin coating film in the case of the positive type) which passes through the above-mentioned developing step and absorbing step, and further passes through the above-mentioned cleaning step as required, decomposing and removing an organic constituent in the resin pattern, and forming the electroconductive pattern which is composed of an oxide of the metal component in the liquid containing the metal component absorbed in the resin pattern. Although depending on the type of an organic constituent contained in a resin pattern, or the like, the baking can be usually performed by placing the substrate under the temperature of 400° C. to 600° C. for several minutes to tens minutes. The baking can be performed, for example, by a circulating hot air oven, or the like. Owing to this baking, it is possible to obtain the electroconductive pattern of metal oxide with a predetermined pattern shape on the substrate.

The reducing step is a step of reducing selectively and lowering the resistance of a part of the electroconductive film of metal oxide formed at the baking step. By heating the substrate under an evacuated or reductive atmosphere (for example, under 2% of hydrogen/nitrogen ambient atmosphere or the like) after covering desired regions to be left as metal oxide in the electroconductive film of metal oxide, obtained at the above-mentioned step, with a gas shielding layer such as an insulating layer, portions which are exposed in the ambient atmosphere are reduced, and metal film regions of the same metal as the metal oxide are formed. Although the change that electric resistance drops and gloss arises is seen in the metal film regions, it is possible to confirm difference between with the metal oxide regions such as the significant reduction of oxides in regions other than a surface and the vicinity of the substrate also by a spectrum method such as XPS.

Here, the gas shielding layer may be a layer which can shield the migration of a gas such as oxygen or hydrogen between the region covered with the gas shielding layer which is the above-mentioned electroconductive film, and the ambient atmosphere where the above-mentioned electroconductive film is located at the above-mentioned reducing step. For example, an insulating member which is composed of lead oxide and glass frit is used.

According to the above steps, the electroconductive pattern which has a lower resistance region and a high resistance region can be obtained.

It is also possible to produce the electroconductive pattern with the same structure by a method of forming a metal film all over a substrate by a sputtering system or the like, covering a necessary location with a mask such as photoresist, forming a necessary electroconductive pattern by the etching processing of the other portions. Nevertheless, since a lot of metal component is removed at the time of etching and development, time and effort, and a facility load for recovering and reusing this are large, and hence, it is difficult to produce the electroconductive pattern at lower cost in comparison with this method.

(4) Production Method of Electron-Emitting Device, Electron Source, and Image Display Device It is possible to use suitably the formation method of an electroconductive pattern of the present invention, mentioned above, at the forming step of an electrode or wiring, as a production method of an electron-emitting device having an electrode, an electron source having a plurality of electron-emitting devices and wiring for driving these, and further, an image display device equipped with this electron source and an image forming member which emits light by the irradiation of electron rays emitted from the electron-emitting devices of the electron source. Thus, by forming an electrode by the method of the present invention at the time of the production of the above-mentioned electron-emitting device, and by forming either or both of electrodes and wiring of electron-emitting devices to be used, by the method of the present invention at the time of the production of the above-mentioned electron source or image display device, it is possible to significantly reduce the amount of constitution materials of the electrodes and/or wiring removed in production process, and to lessen significantly the time and effort required for the processing of removed objects during production.

What is preferable as the electron-emitting device which has an electrode produced using the formation method of the electroconductive pattern of the present invention, as mentioned above, is a cold cathode device such as a surface conduction type electron-emitting device, a field emission type (FE type) electron-emitting device, a metal/insulating layer/metal mold (MIM type) electron-emitting device. What is preferable among these is the surface conduction type electron-emitting device with a feature that it is easy to form electrodes of many electron-emitting devices by the method of the present invention at once. In addition, according to the method of the present invention, since the formation of device electrodes of a plurality of electron-emitting devices, and the formation of wiring necessary for driving each electron-emitting device can be formed concurrently, the production of an electron source having a plurality of electron-emitting devices becomes easy. Furthermore, it is possible to mitigate significantly a load at the time of the production of an image display device which is produced by combining this electron source, and an image forming member which forms an image by the irradiation of electron rays from the electron-emitting devices which constitute the electron source.

By forming concurrently the electrodes of such electron-emitting devices, for example, with setting electrodes in a signal line side in high resistance, and setting electrodes in a scanning line side in lower resistance, it becomes possible to decrease the influence on an electron-emitting device when electric charges accumulated during driving discharge. In addition, it is also possible to make a high resistivity region and a low resistance region in a device electrode. Furthermore, in an electron source, it becomes possible to control a formation position of an electron-emitting region, by forming an electron-emitting region formation part at high resistance and forming the other part at lower resistance.

In these electron-emitting device, electron source, and image display device, it is possible to evaluate uniformity with a device current (If), an emission current (Ie), electron emission efficiency (η=Ie/If) and coefficient of variation of those.

Figure 1B:
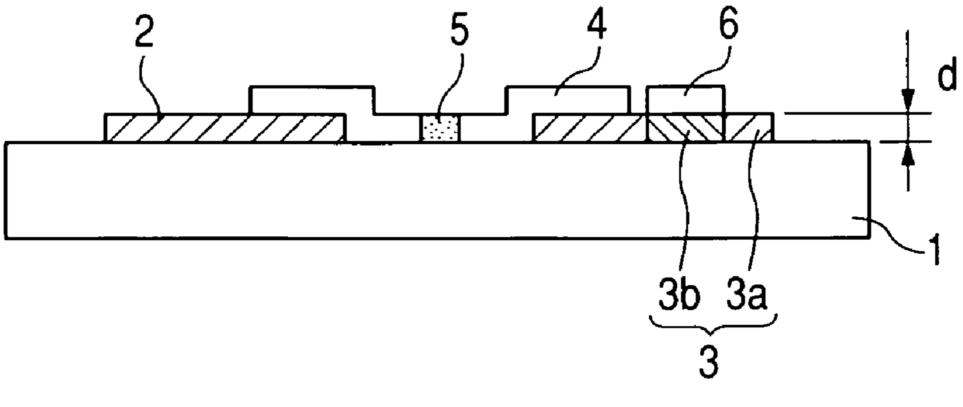

FIGS. 1A and 1B show the structural example of an electron-emitting device according to the present invention. In the figure, FIG. 1A is a schematic top view, and FIG. 1B is a schematic sectional view taken on line 1B-1B in FIG. 1A. In addition, the figures show a substrate 1, device electrodes 2 and 3, a low resistance region 3*a*, a high resistance region 3*b*, an electroconductive thin film 4, and an electron-emitting region 5. An example of the production process of the electron-emitting device concerned will be explained below.

[Step 1]

The device electrode 2 and the device electrode 3 which has the low resistance region 3*a*, and high resistance region 3*b* are formed by the formation method of an electroconductive pattern of the present invention, which is described above, after the substrate 1 is fully cleaned with a detergent, deionized water, and an organic solvent.

What are used as the substrate 1 are a quartz glass, a glass whose impurity contents such as Na are reduced, a soda lime glass, a stacked body formed by stacking $SiO_2$ on the soda lime glass by a sputtering method or the likes ceramics such as alumina, a Si substrate, and the like.

A device electrode gap L is tens of nm to hundreds of μm, and is set by photolithography technique, which is the fundamental of a production method of the device electrodes 2 and 3, that is, the performance of an exposure machine and an etching method, or the like, and a voltage applied between the device electrodes 2 and 3. Nevertheless, it is preferably several μm to tens of μm.

The length W and film thickness d of the device electrodes 2 and 3 are suitably designed from the viewpoint of resistances of the electrodes, connection with wiring, and a subject on the arrangement of the electron source in which many electron-emitting devices are located. Usually, the length W is several μm to hundreds of μm, and the film thickness d is several nm to several μm.

[Step 2]

An electroconductive thin film 4 which communicates between the device electrodes 2 and 3 is formed. Since the low resistance region 3*a* and high resistance region 3*b* are formed in the device electrode 3 in this structural example, it becomes possible to decrease the influence, which is given to an electron-emitting device when electric charges accumulated during driving discharge, which is preferable.

In order to obtain a favorable electron emission characteristic, it is preferable to use a fine particle film, which is composed of fine particles, as an electroconductive thin film 4. Its film thickness is suitably set in consideration of step coverage to the device electrodes 2 and 3, resistance between the device electrode 2 and 3, forming condition described later, and the like.

Since the thermal stability of the electroconductive thin film 4 may govern the service life of the electron emission characteristic, it is desirable to use a material with a higher melting point as the material of the electroconductive thin film 4. Nevertheless, usually, the higher the melting point of the electroconductive thin film 4 is, the larger electric power necessary for the electric forming later described becomes. Furthermore, depending on the shape of the electron-emitting region obtained consequently, there is a case of causing a problem in the electron emission characteristic that an applied voltage (threshold voltage) which can perform electron emission rises.

In the present invention, since a material with a high melting point is not necessary especially as a material of the electroconductive thin film 4, it is possible to select a material and its form which are possible to form a favorable electron-emitting region with comparatively small forming electric power.

What is used preferably as an example of the material which satisfies the above-mentioned conditions is a film which is formed at the film thickness, at which Rs (sheet resistance) shows the resistance of $1\times10^2$ to $1\times10^7$ Ω/sq, from a conductive material such as Ni, Au, PdO, Pd, or Pt. Furthermore, Rs is a value which appears when the resistance R which is obtained by measuring in a longitudinal direction a thin film with thickness t, width w, and length 1 is set at R=Rs (1/w), and let resistivity be ρ, and Rs=ρ/t. The film thickness which shows the above-mentioned resistance is in a range of about 5 nm to 50 nm. It is preferable that a thin film of each material has a form of the fine particle film in this film thickness range.

The particle size of fine particles is within a range of several Å to hundreds of nm, and preferably, within a range of 1 nm to 20 nm.

Furthermore, PdO among the materials exemplified previously is a preferable material because of capability of thin film formation being easily carried out by baking of an organic Pd compound in the air, comparatively low electric conductivity because of a semiconductor, and wideness of a process margin of film thickness for obtaining the resistance Rs within the above-mentioned range, capability of easy reduction of membrane resistance because of capability of easily making a gap 5 metal Pd after forming the gap 5 in the electroconductive thin film 4, and the like. Nevertheless, the effect of the present invention is not limited to PdO, and is not limited to the above-mentioned materials which are exemplified.

As a specific formation method of the electroconductive thin film 4, for example, an organic metal film is formed by applying and drying an organic metal solution between the device electrodes 2 and 3, which are provided on the substrate 1. Furthermore, the organic metal solution is a solution of organometallic compounds whose main elements are metals such as Pd, Ni, Au, and Pt which are the above-mentioned conductive thin film materials. Then, the organic metal film is baked, and is patterned by lift off, etching, or the like, and the electroconductive thin film 4 is formed. In addition, it is also possible to form the film by a vacuum deposition method, a sputtering method, a CVD method, a distributed application method, a dipping method, a spinner method, an ink jet method, or the like. FIGS. 1A and 1B show examples of being formed by being given a solution containing an electroconductive thin film material by the ink jet method.

[Step 3]

Then, the processing of sending an electric current which is called forming is performed. Specifically, by applying a pulse-like voltage or a rising voltage between the device electrodes 2 and 3 by a power supply not shown, the gap 5 is formed at a part of the electroconductive thin film 4.

Furthermore, electrical treatment after the forming processing is performed within a suitable vacuum device.

[Step 4]

An activation operation is performed to the device whose forming is finished. The activation operation is performed by applying a voltage between the device electrodes 2 and 3 under the suitable degree of vacuum of an ambient atmosphere containing a carbon compound gas. By this processing, a carbon film (not shown) whose main components are carbon and/or a carbon compound deposits from the carbon compound, which exists in the ambient atmosphere, on the electroconductive thin film 4. Then, the device current If and the emission current Ie come to vary remarkably.

Here, the carbon and/or carbon compound is, for example, graphite (including so-called HOPG, PG, and GC: HOPG means what has the nearly perfect crystal structure of graphite; PG means what has the crystal grain of about 20 nm and the slightly irregular crystal structure; and GC means what has the crystal grain of about 2 nm and the further irregular crystal structure), or amorphous carbon (this means amorphous carbon and a microcrystal mixture of amorphous carbon and the above-mentioned graphite).

What can be cited as the suitable carbon compound used in the activation process are aliphatic hydrocarbons such as alkanes or alkenes or alkynes, aromatic hydrocarbons, alcohols, aldehydes, ketones, amines, phenols, organic acids such as caboxylic acids or sulfonic acids, and the like. Specifically, what can be used are saturated hydrocarbons, expressed as $C_nH_{2n+2}$, such as methane, ethane, and propane; unsaturated hydrocarbons, expressed in an empirical formula of $C_nH_{2n}$, such as ethylene and propylene; benzene, toluene, methanol, ethanol, formaldehyde, acetaldehyde, acetone, methyl ethyl ketone, methylamine, ethylamine, phenol, benzonitrile, tolunitrile, formic acid, acetic acid, propionic acid, and the like; and mixtures of these.

[Step 5]

A stabilization step is preferably performed to the electron-emitting device produced as mentioned above. This step is a step of evacuating the carbon compound in a vacuum chamber. Although it is desirable to eliminate the carbon compounds in the vacuum chamber as much as possible, it is preferable that the partial pressure of the carbon compounds is $1\times10^{-8}$ Pa or less. In addition, it is preferable that pressure including other gases is $1\times10^{-6}$ Pa or less, and in particular, it is further preferable to be $1\times10^{-7}$ Pa or less. An apparatus not using oil is used for an evacuation apparatus which evacuates a vacuum chamber lest oil generated from the apparatus should affect characteristics of the device. Specifically, it is possible to cite evacuation apparatuses such as a sorption pump and an ion pump. Furthermore, when evacuating the inside of the vacuum chamber, the whole vacuum chamber is heated so that carbon compound molecules adsorbing to an inner wall of the vacuum chamber and the electron-emitting device may be easily evacuated. As heating conditions at this time, it is desirable to be 150 to 350° C., preferably 200° C. or more, for a long time as long as possible, but it is not limited to these conditions especially. Nevertheless, the heating is performed under conditions suitably selected by terms and conditions such as the size and the shape of a vacuum chamber and the arrangement of electron-emitting devices.

Although it is preferable to maintain an ambient atmosphere at the time of the completion of the above-mentioned stabilization operation as the ambient atmosphere after the stabilization step, the ambient atmosphere is not limited to this. So long as the carbon compound is removed sufficiently, it is possible to maintain sufficiently stable characteristics even if pressure itself rises a bit.

Since it is possible to suppress the deposition of new carbon or carbon compounds by adopting such a vacuum ambient atmosphere, the shape of the film having carbon which is the present invention is maintained, and as a result, the device current If and the emission current Ie are stabilized.

Although the arrangement of electron-emitting devices is not limited especially in an electron source which uses the electron-emitting devices according to the present invention, what is applied preferably is an array form that n lines of Y-directional wiring is installed through an interlayer insulation layer on m lines of X-directional wiring, and the X-directional wiring and Y-directional wiring are connected to each pair of device electrodes of an electron-emitting device, that is, so-called simple matrix arrangement. This simple matrix arrangement will be explained below in full detail.

Emission electrons from a surface conduction type electron-emitting device can be controlled with a peak value and a range of a pulse-like voltage, which is applied between the device electrodes which face each other, when the voltage is a threshold voltage or higher. On the other hand, they are hardly emitted when being below the threshold voltage. According to these characteristics, so long as the above-mentioned pulse-like voltage is suitably applied to each device even if many electron-emitting devices are located, it is possible to select a surface conduction type electron-emitting device according to an input signal, and to control the amount of electron emission.

Figure 8:
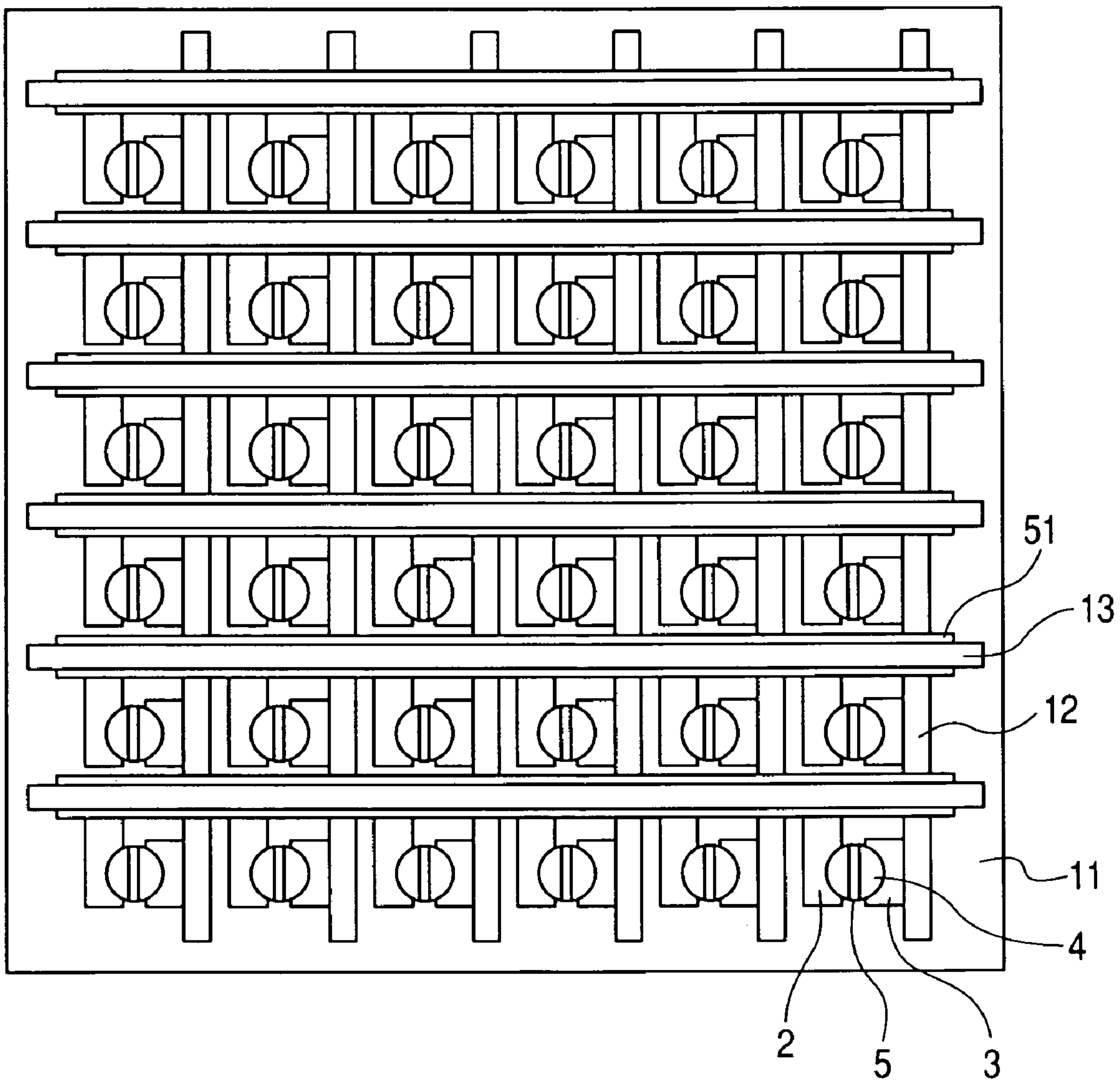
FIG. 8 is a schematic diagram showing the structure of an example of the electron source according to the present invention.

Hereafter, the plane schematic diagram of an example of the electron source constituted on the basis of this principle is shown in FIG. 8. FIG. 8 shows a substrate 11, X-directional wiring 12, Y-directional wiring 13, and an interlayer insulation layer 51.

In FIG. 8, a plurality of X-directional wiring 12 and Y-directional wiring 13 are composed of electroconductive metal used as the desired pattern respectively, and a material, film thickness, and wiring width are set so that almost equal voltages may be supplied to the many electron-emitting devices. The interlayer insulation layer 51 is arranged between the plurality of X-directional wiring 12 and n lines of Y-directional wiring 13, which are separated electrically and constitute the matrix wiring.

In the production method of an electron source of the present invention, either, or two or more of the device electrodes 2 and 3, X-directional wiring 12, and Y-directional wiring 13 are formed by the formation method of an electroconductive pattern of the present invention. Specifically, for example, one side of the X-directional wiring 12 and device electrode 3 is set at higher resistance than another side, which can be formed at the same step.

The interlayer insulation layer 51 is $SiO_2$ or the like formed by a vacuum evaporation method, a printing method, a sputtering method, or the like, and is formed in a desired shape on the whole surface or partial surface of the insulating substrate 11 in which the X-directional wiring 12 is formed, and in particular, film thickness, material, and a production method are suitably set so that the layer can bear the potential difference of a crossing section of the X-directional wiring 12 and Y-directional wiring 13. The X-direction wiring 12 and Y-directional wiring 13 are drawn out as external terminals, respectively.

Scanning signal application means which is not shown and applies a scanning signal for scanning rows of the electron-emitting devices 14, arranged in an X-direction, according to an input signal is connected electrically to the above-mentioned X-directional wiring 12. On the other hand, modulating signal generation means which is not shown and applies a modulating signal for modulating each column of the electron-emitting devices 14, arranged in a Y direction, according to an input signal is connected electrically to the Y-directional wiring 13.

Furthermore, a drive voltage applied to each electron-emitting device 14 is supplied as a difference voltage between the scanning signal applied to the device concerned and the modulating signal.

Figure 2:
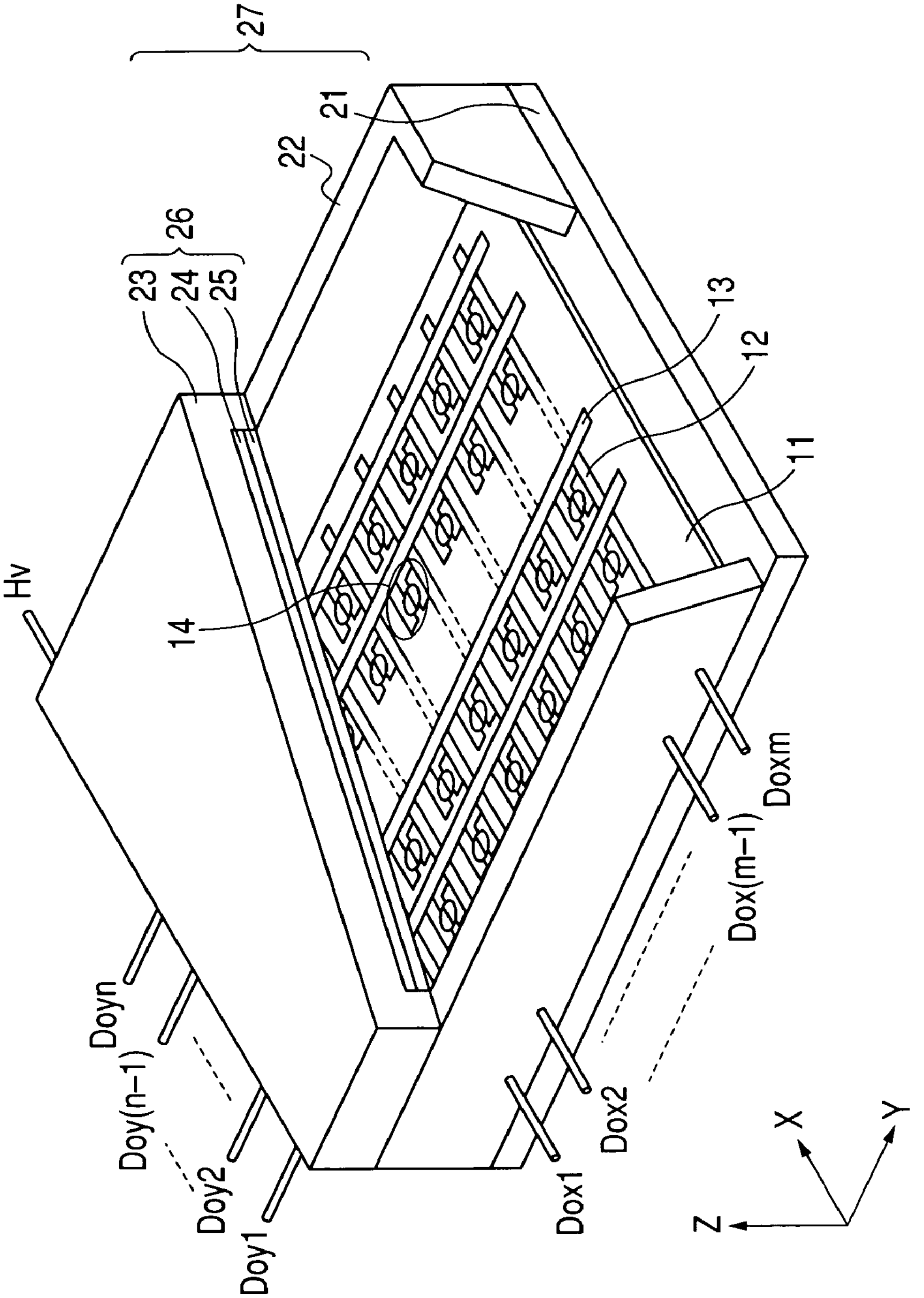
FIG. 2 is a schematic diagram showing the structure of a display panel which is an example of an image display device according to the present invention.

An example of a display panel of an image display device which uses the electron source in FIG. 8 is schematically shown in FIG. 2. FIG. 2 is a perspective view in the state that a part of the display panel concerned is cut for convenience, where a rear plate 21 fixes the electron source substrate 11 on which the plurality of electron-emitting devices 14 are formed, and a face plate 26 is composed of a glass substrate 23 on an inner surface of which a fluorescent screen 24, a metal back 25, and the like are formed. A housing 22 constitutes an envelope 27 by applying frit glass, and performing sealing by baking the rear plate 21, housing 22, and face plate 26 for 10 minutes or more at 400 to 500° C. in the nitrogen or in the air.

Although the above-described envelope 27 is constituted of the face plate 26, housing 22 and rear plate 21, the rear plate 21 which is a separate member is unnecessary when the substrate 11 itself has sufficient strength since the rear plate 21 is provided in order to mainly reinforce the strength of the electron source substrate 11. Hence, it is sufficient to constitute the envelope 27 with the face plate 21, housing 22, and substrate 11 by sealing directly the housing 22 to the substrate 11.

On the other hand, it is also possible to constitute the envelope 27, which has sufficient strength to atmospheric pressure, by installing a supporting member, which is not shown and is called a spacer, between the face plate 26 and rear plate 21.

In addition, the metal back 25 is usually provided in the inner surface side of the fluorescent screen 24. The metal back 25 aims at enhancing luminance by performing the mirror reflection of light to an inner surface side among photogenesis of a fluorescent substance toward the face plate 26, making itself act as an electrode for applying an electron beam accelerating voltage, protecting the fluorescent substance from damage due to the collision of negative ions generated within the envelope 27, and the like. It is possible to produce the metal back 25 by forming the fluorescent screen 24, performing smoothing (usually called filming) of the inner surface of the fluorescent screen 24, and thereafter, depositing Al by vacuum deposition or the like.

In order to increase the electroconductivity of the fluorescent screen 24, a transparent electrode (not shown) may be provided on the face plate 26 in the external surface side of the fluorescent screen 24.

When performing the above-mentioned sealing, it is necessary to perform sufficient alignment since it is necessary in the case of color display to make each color fluorescent substance correspond to each electron-emitting device.

The sealing of the envelope 27 is performed after reaching the degree of vacuum of about $1.3\times10^{-5}$ Pa through an exhaust pipe not shown. In addition, a getter processing may be also performed in order to maintain the degree of vacuum after the sealing of the envelope 27. This is the processing of heating a getter (not shown) located in a predetermined position in the envelope 27 by a heating method such as resistance heating or high-frequency heating just before or after the sealing of the envelope 27, and forming an evaporation film. A main component of the getter is usually Ba or the like and is used for maintaining, for example, the degree of vacuum of $1.3\times10^{-3}$ Pa to $1.3\times10^{-5}$ Pa by an adsorption action of the evaporation film.

In the image display device completed thereby, by making each electron-emitting device 14 perform electron emission by applying a voltage to the X-directional wiring 12 and Y-directional wiring 13 from terminals outside a package, applying a high voltage of several kV or more to the metal back 25 or a transparent electrode (not shown) through high-voltage terminals Hv, accelerating electron beams to make them collide to the fluorescent screen 24, and making the fluorescent screen 24 perform excitation and light emission, an image is displayed.

Furthermore, the structure described above is a schematic constitution necessary when producing the preferable image display device used for display or the like. For example, detailed portions such as materials of respective members are not limited to the above-mentioned contents, but they are suitably selected so that they may be suitable for an application of the image display device.

According to the fundamental characteristics of the electron-emitting device according to the present invention, emission electrons from an electron-emitting region is controlled with a peak value and a range of a pulse-like voltage which is applied between the device electrodes, which face each other, above a threshold voltage. Further, current amount is also controlled with its intermediate value, and hence, halftone display becomes possible.

In addition, when many electron-emitting devices are located, a selection line is determined by a scanning line signal of each line, and the above-mentioned pulse-like voltage is applied to each device suitably through each information signal line, it becomes possible to apply a voltage to an arbitrary device suitably, and to turn on each device.

Moreover, as a system of modulating an electron-emitting device according to an input signal having intermediate tone, a voltage modulation system and a pulse width modulation system are cited.

EXAMPLES

Hereafter, although the present invention will be explained in more detail using an embodiment, this embodiment does not limit the present invention.

Example 1

As a photosensitive resin, the coating liquid of a methacrylic acid-methyl methacrylate-ethyl acrylate-n-butyl acrylate-azobisisobutyronitrile polymer was applied to a glass substrate (75 mm high×75 mm wide×2.8 mm thick) with a roll coater on the entire surface, and was dried for 2 minutes at 45° C. on a hot plate. Next, using a negative type photomask, with an extra-high pressure mercury lamp (illuminance: 8.0 mW/cm$^2$) as a light source, the substrate and mask were contacted and were exposed for exposure time of 2 seconds. Next, using deionized water as a chemical developer, the substrate was processed for 30 seconds by dipping, and the resin pattern with film thickness of 1.35 μm was obtained.

After this resin pattern-formed substrate was soaked for 30 seconds into the deionized water, it was soaked in tris(2,2'-bipyridine)ruthenium(II) chloride aqueous solution (ruthenium content: 1 mass %) for 60 seconds.

Next, the substrate was pulled out, and was cleaned with running water for 5 seconds so that a Ru complex solution between resin patterns was cleaned. Then, air was sprayed to drain off water, and the substrate was dried with an 80° C. hot plate for 3 minutes.

Then, the substrate was baked for 30 minutes at 500° C. in a hot blast circulating reactor, and ruthenium oxide electrodes with the inter-electrode distance of 20 μm, the width of 60 μm, the length of 120 μm, and the thickness of 25 nm were formed.

An insulating layer composed of lead oxide and glass frit was formed as a heat-resistant gas shielding layer in a center portion of this electrode by screen printing and development in the dimensions of 60 μm wide and 30 μm thick.

Next, the substrate was heated in a vacuum ambient atmosphere for 30 minutes at 400° C. in a vacuum baking furnace. Portions where the electrodes were exposed became metal ruthenium since ruthenium oxide was reduced, and portions where electrodes lapped with the insulating layer were still ruthenium oxide without being reduced. The sheet resistance value of the metal ruthenium portion was 35 Ω/sq, and the sheet resistance value of the ruthenium oxide portion was 185 Ω/sq.

Example 2

Electrodes were produced similarly to the first example except using a tetraamminepalladium(II) acetate solution (palladium content: 1 mass %) as the metallic compound solution. The sheet resistance value of the metal palladium portion was 30 Ω/sq, and the sheet resistance value of the palladium oxide portion was 4.5 kΩ/sq.

Example 3

While producing a plurality of surface conduction type electron-emitting devices using the formation method of an electroconductive pattern of the present invention, wiring for driving the plurality of surface conduction type electron-emitting devices was formed to produce an electron source, and an image display device was further produced using this electron source. Hereafter, production procedure will be described on the basis of FIGS. 2 to 8.

[Step 1]

Figure 3:
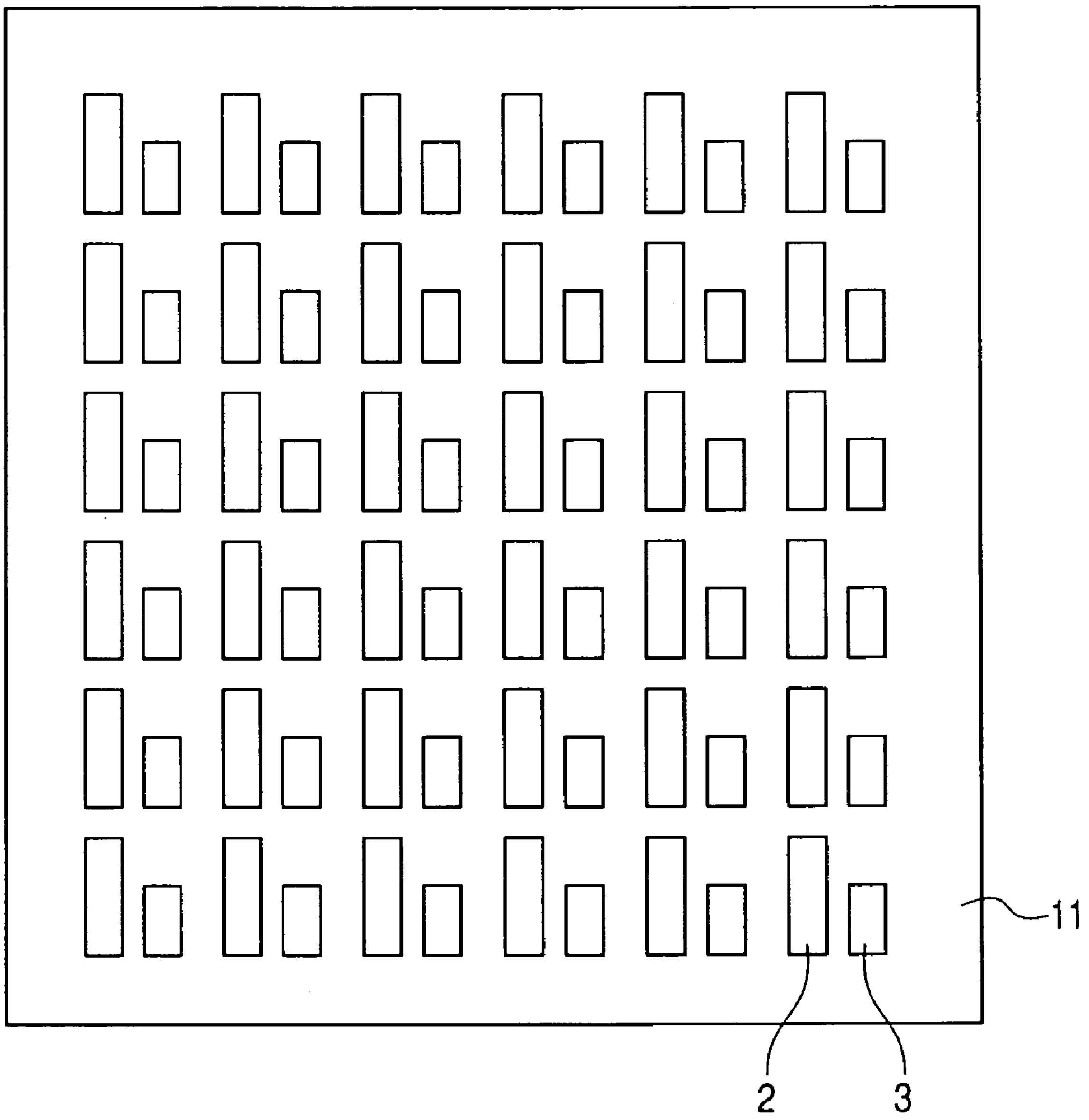
FIG. 3 is a production process drawing of an electron source according to the present invention.

On the glass substrates 11 with 300 mm wide×300 mm long×2.8 mm thick, ruthenium oxide electrodes were formed as the device electrodes 2 and 3 by the same method as the first example (FIG. 3).

In this example, the device electrode 3 with 60 μm wide and 480 μm long, and the device electrode 2 with 120 μm wide and 200 μm long were made so as to face each other at the inter-electrode gap of 20 μm. In addition, a pitch between the device electrodes 2 and 3 was made 300 μm in a cross direction and 650 μm in longitudinal direction, and pairs of the device electrodes 2 and 3 were located in 720×240 matrix. When a 1 cm×1 cm ruthenium oxide film pattern was formed concurrently with the formation of device electrode pairs and its sheet resistance was measured, it was 180 Ω/sq.

[Step 2]

Figure 4:
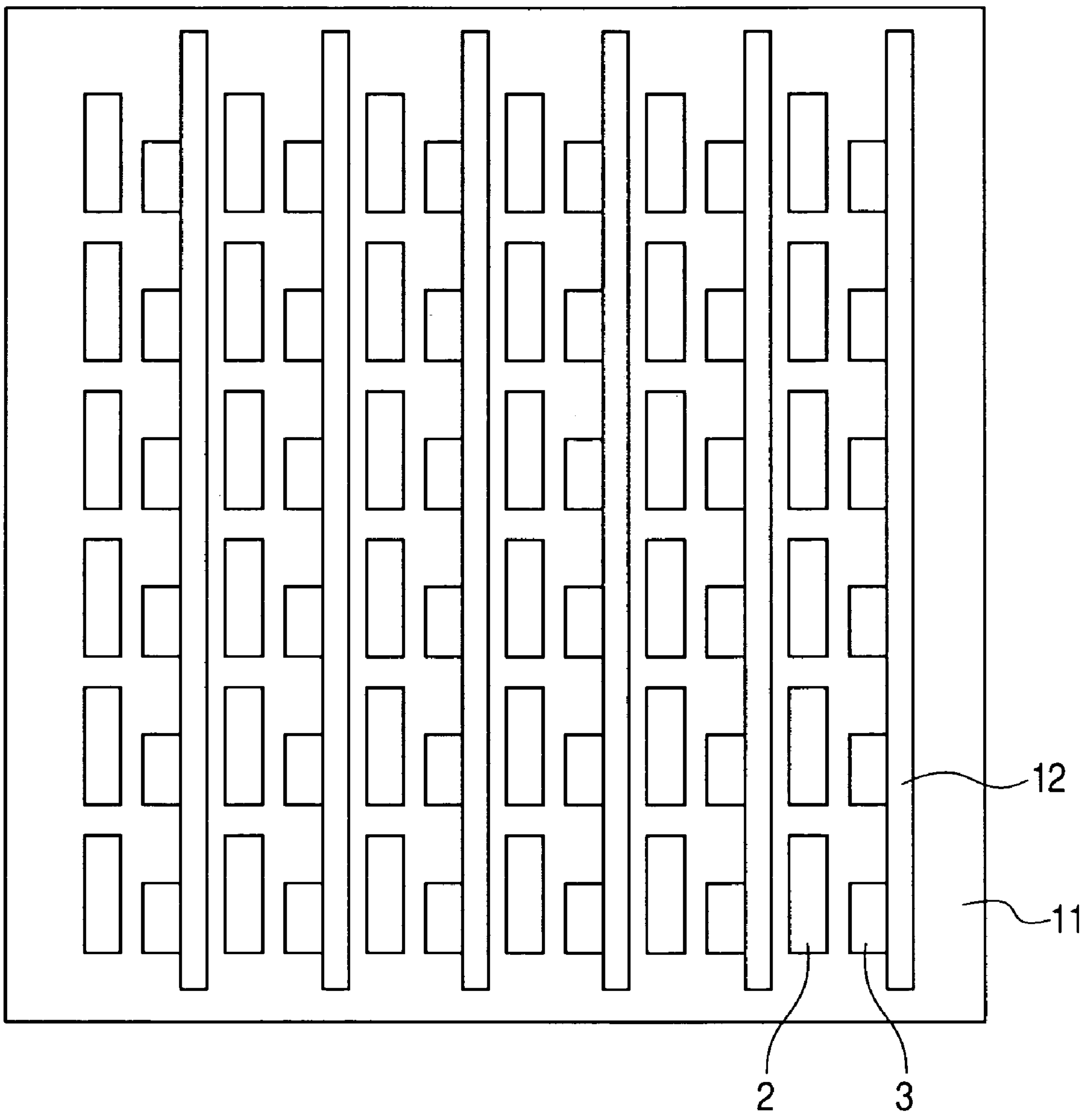
FIG. 4 is a production process drawing of the electron source according to the present invention.
Figure 5:
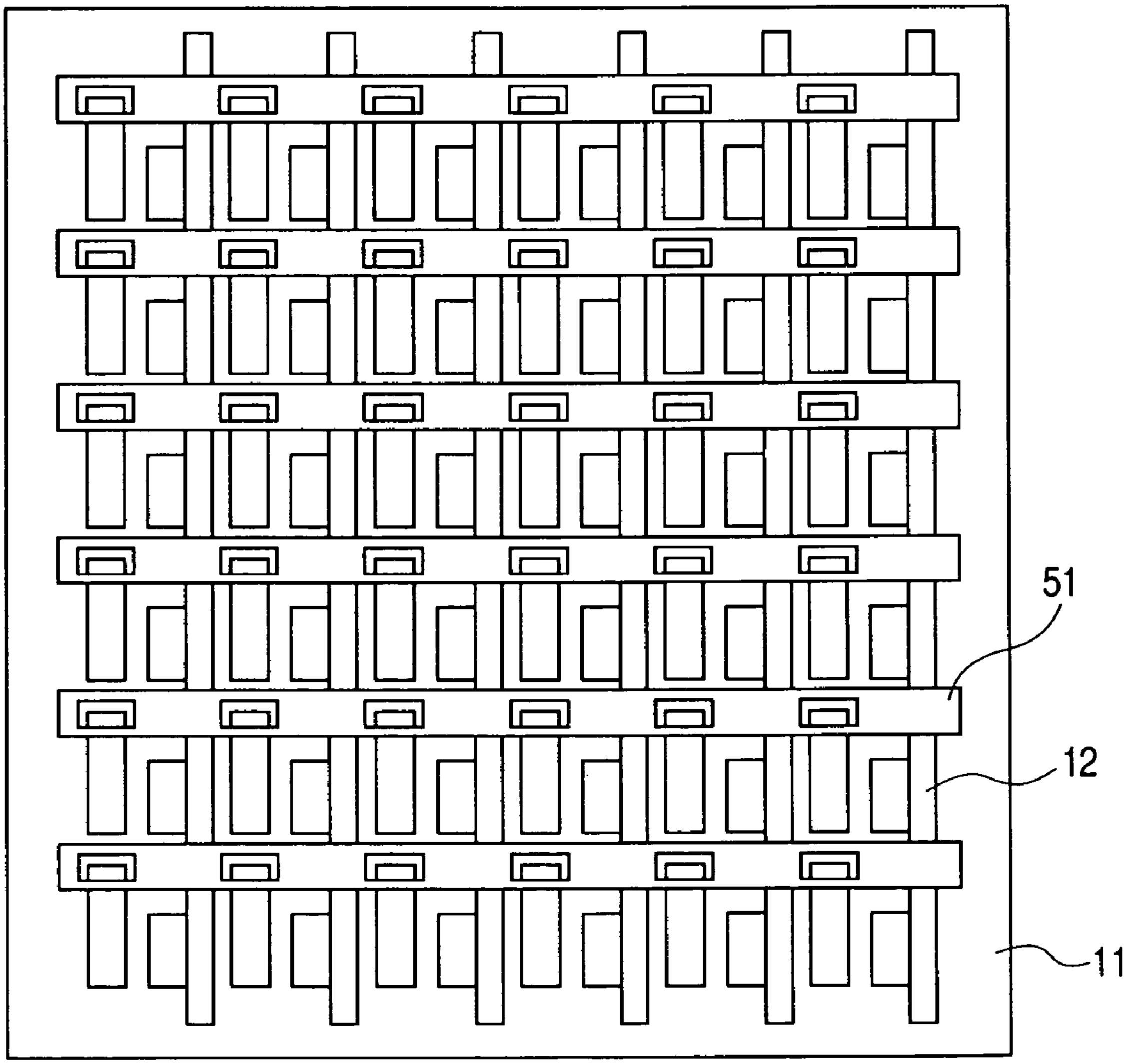
FIG. 5 is a production process drawing of the electron source according to the present invention.
Figure 6:
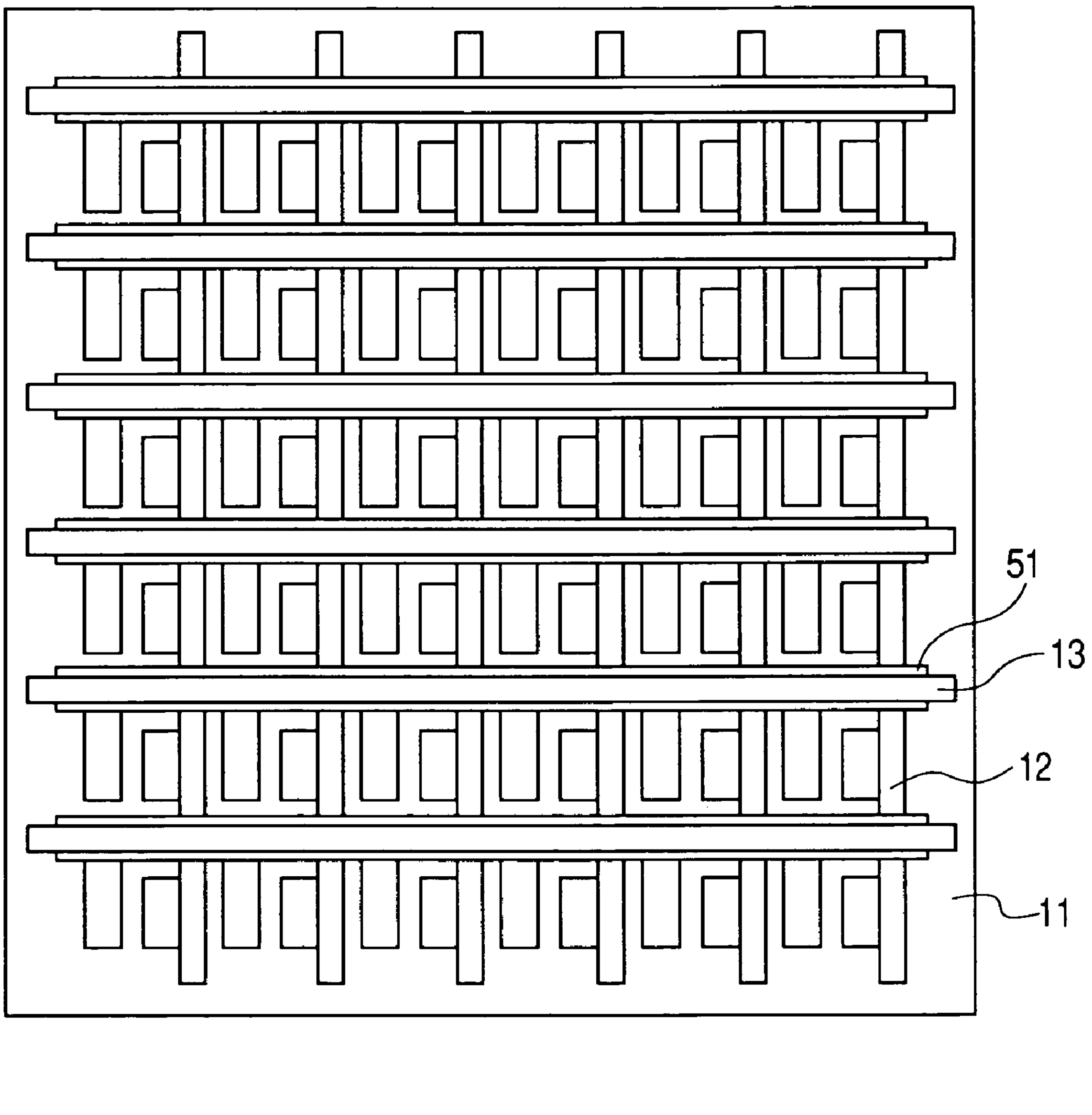
FIG. 6 is a production process drawing of the electron source according to the present invention.
Figure 7:
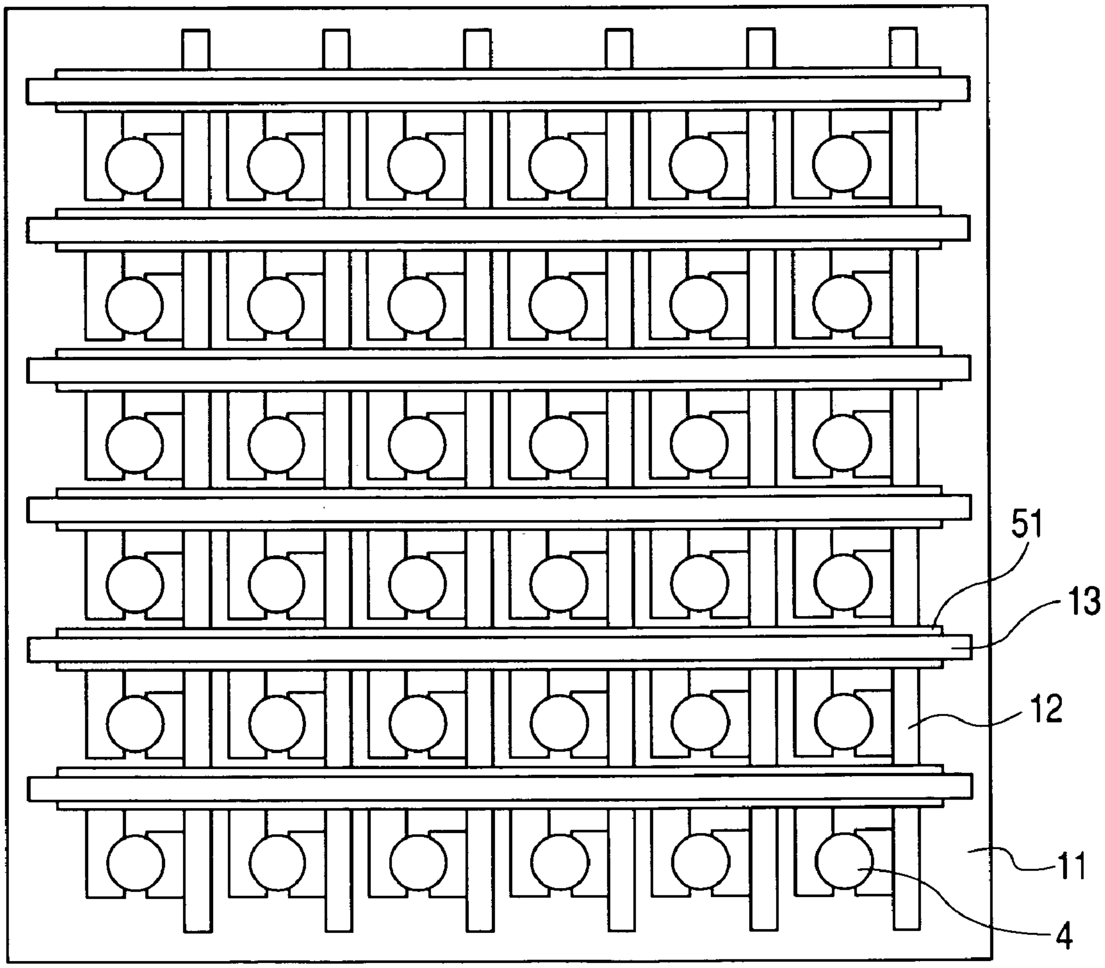
FIG. 7 is a production process drawing of the electron source according to the present invention.

A pattern of the X-directional wiring 12 which connected device electrodes 3 which were one side in each column of device electrode pairs was annexed by screen printing using silver wiring paste (FIG. 4). Next, the 20-μm-thick interlayer insulating layer 51 was annexed by screen printing (FIG. 5), on which a pattern of Y-directional wiring 13 which connected the device electrodes 2 which were another side of the device electrode pairs in each row was annexed (FIG. 6) similarly to the X-directional wiring 12, and they were baked and were made as the X-directional wiring 12 and Y-directional wiring 13.

[Step 3]

The substrate 1 on which the X-directional wiring 12 and Y-directional wiring 13 were formed was heated in a vacuum ambient atmosphere for 30 minutes at 400° C. in a vacuum baking furnace. When the sheet resistance of the above-mentioned ruthenium oxide film pattern at this point was measured using the above-mentioned pattern, it became low, that is, 35 Ω/sq because ruthenium oxide was reduced to ruthenium. The portion of the electrode covered with the interlayer insulation layer 51 kept 180 Ω/sq because it was not reduced and remained to be ruthenium oxide.

[Step 4]

A straw-color aqueous solution was obtained by dissolving palladium acetate-monoethanolamine complex into an aqueous solution, where 0.05 mass % concentration of polyvinyl alcohol, 15 mass % concentration of 2-propanol, and 1 mass % concentration of ethylene glycol were dissolved, so that palladium might become approximately 0.15 mass % concentration.

Liquid droplets of the above-mentioned aqueous solution were given to the same location four times from above the device electrodes 2 and 3 which formed each device electrode pair by the ink jet method so as to extend over the device electrodes 2 and 3 concerned and to be annexed in an electrode gap (dot diameter=nearly 100 μm).

The substrate 11 on which the liquid droplets of the above-mentioned aqueous solution were annexed was baked for 30 minutes in a 350° C. baking furnace, a palladium membrane 14 which communicated between the device electrodes 2 and 3 was formed between respective device electrode pairs (FIG. 7), and the substrate 11 concerned was fixed to the rear plate 21.

[Step 5]

The envelope 27 was constituted by making the face plate 26, where the fluorescent screen 24 and the metal back 25 were formed on an inner surface of the glass substrate 23 which was different from the above-mentioned substrate 11, face the above-mentioned rear plate 21, and sealing them through the housing 22. An air supply and exhaust tube used for ventilation and exhaust was bonded to the housing 22 beforehand.

[Step 6]

After exhausting the inside of the envelope through the air supply and exhaust tube up to $1.3\times10^{-5}$ Pa, the surface conduction type electron-emitting device was formed (FIG. 8) by using X-directional terminals Doxl to Doxn which connected to each X-directional wiring 12, and Y-directional terminals Doyl to Doym which connected to each Y-directional wiring 13, applying a voltage between a device electrode pair in each column, and performing the forming of generating tens of μm of fissure portions in the palladium membrane 4 between the device electrodes 2 and 3 for every line.

Benzonitrile was introduced from the air supply and exhaust tube until the inside of an envelope 27 became $1.3\times10^{-2}$ Pa after exhausting the inside of the envelope 27 up to $1.3\times10^{-5}$ Pa, and similarly to the above-mentioned forming, activation of supplying a pulse voltage between each device electrode pair, and making carbon deposit on the fissure portion of the above-mentioned palladium membrane 14 was performed. The pulse voltage was applied for 25 minutes to each line.

[Step 8]

After fully exhausting the inside of the envelope 27 from the air supply and exhaust tube, it was further evacuated with the whole envelope 27 being heated at 250° C. for 3 hours, the getter was flushed finally, and the air supply and exhaust tube was sealed.

Thus, the display panel as shown in FIG. 2 was produced, a drive circuit which is composed of a scan circuit, a control circuit, a modulation circuit, a direct current voltage supply, and the like which were not shown was connected, and the panel-like image display device was produced.

It was possible to display an arbitrary matrix image pattern in favorable image quality by applying a predetermined voltage to each surface conduction type electron-emitting device in time-sharing through X-directional terminals Doxl to Doxn and Y-directional terminals Doyl to Doym, and applying a high voltage to the metal back 25 through the high voltage terminal HV.

Example 4

Similarly to the third example except omitting step 3 and setting the heating temperature in step 8 at 400° C., an image display device was produced. It was possible to display an arbitrary matrix image pattern in favorable image quality.

This application claims priority from Japanese Patent Application No. 2004-162968 filed on Jun. 1, 2004, which is hereby incorporated by reference herein.

What is claimed is:

1. A formation method of an electroconductive pattern, comprising steps of:

forming a pattern of a photosensitive resin;

supplying liquid containing a metal component so as to be absorbed into the photosensitive resin;

baking the resin pattern which absorbs the liquid containing a metal component to form a pattern of an electroconductive film of a metal oxide;

covering a partial region of the electroconductive film with a gas shielding layer; and heating the electroconductive film under an evacuated or reductive atmosphere, to reduce the electroconductive film in regions thereof except for the partial region covered with the gas shielding layer.

2. The formation method of an electroconductive pattern according to claim 1, wherein the photosensitive resin is water-soluble.

3. The formation method of an electroconductive pattern according to claim 1, wherein the liquid containing a metal component is an aqueous solution where a water-soluble metal organic compound is dissolved in an aqueous solvent component.

4. The formation method of an electroconductive pattern according to claim 3, wherein the metal organic compound is at least one kind of complex compound of ruthenium, palladium, nickel, and copper.

5. The formation method of an electroconductive pattern according to claim 1, wherein at least one kind selected from rhodium, bismuth, vanadium, chromium, tin, lead, silicon, and compounds of these is added to the liquid containing a metal component.

6. A production method of an electron-emitting device having an electrode, wherein the electrode is formed by the formation method of an electroconductive pattern according to any one of claims 1 to 5.

7. A production method of an electron source having a plurality of electron-emitting devices which have electrodes respectively, and wiring for driving the electron-emitting devices, wherein at least either of the electrodes or wiring is formed by the formation method of an electroconductive pattern according to any one of claims 1 to 5.

8. A production method of an image display device which has an electron source having a plurality of electron-emitting devices having electrodes respectively, and wiring for driving the electron-emitting devices, and an image forming member which emits light by irradiation of electrons emitted from the electron-emitting devices, wherein the electron source is produced by the production method of an electron source according to claim 7.

9. A formation method of an electroconductive pattern, comprising steps of:

forming a pattern of a resin;

supplying a constituent material of the electroconductive pattern so as to be absorbed into the resin;

baking the resin containing the constituent material of the electroconductive pattern to form an electroconductive film of a metal oxide;

covering a partial region of the electroconductive film with a layer; and heating the electroconductive film under an evacuated or reductive atmosphere, to reduce regions of the electroconductive film except for the partial region covered with the layer.

10. A production method of an electron-emitting device having an electrode, wherein the electrode is formed by the formation method of an electroconductive pattern according to claim 9.

11. A production method of an electron source having a plurality of electron-emitting devices which have electrodes respectively, and wiring for driving the electron-emitting devices, wherein at least either of the electrodes or wiring is formed by the formation method of an electroconductive pattern according to claim 9.

12. A production method of an image display device which has an electron source having a plurality of electron-emitting devices having electrodes respectively, and wiring for driving the electron-emitting devices, and an image forming member which emits light by irradiation of electrons emitted from the electron-emitting devices, wherein the electron source is produced by the production method of an electron source according to claim 11.

* * * * *

UNITED STATES PATENT AND TRADEMARK OFFICE

CERTIFICATE OF CORRECTION

PATENT NO. : 7,314,768 B2
APPLICATION NO. : 11/138332
DATED : January 1, 2008
INVENTOR(S) : Tsuyoshi Furuse et al.

It is certified that error appears in the above-identified patent and that said Letters Patent is hereby corrected as shown below:

ON THE TITLE PAGE ITEM [75]:

Inventors, “Tsuyoshi Furuse, Kanagawa-ken (JP); Shosei Mori, Kanagawa-ken (JP); Masahiro Terada, Kanagawa-ken (JP)” should read --Tsuyoshi Furuse, Isehara (JP); Shosei Mori, Hiratsuka (JP); Masahiro Terada, Hadano (JP)--.

COLUMN 1:

Line 34, “only” should read --only one--.

COLUMN 4:

Line 28, “one” should read --the--; and
Line 32, “another” should read --other--.

COLUMN 6:

Line 46, “diation, regions” should read --diation regions--.

COLUMN 9:

Line 57, “likes” should read --like,--.

COLUMN 16:

Line 51, “above the” should read --the above--.

Signed and Sealed this

Twelfth Day of August, 2008

JON W. DUDAS
*Director of the United States Patent and Trademark Office*